United States Patent
Hyde et al.

(10) Patent No.: US 11,069,422 B1
(45) Date of Patent: Jul. 20, 2021

(54) TESTING MULTI-PORT ARRAY IN INTEGRATED CIRCUITS

(71) Applicant: International Business Machines Corporation, Armonk, NY (US)

(72) Inventors: Matthew Steven Hyde, Wappingers Falls, NY (US); Uma Srinivasan, Poughkeepsie, NY (US); Thomas J. Knips, Wappingers Falls, NY (US); Gregory J. Fredeman, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/922,115

(22) Filed: Jul. 7, 2020

(51) Int. Cl.
| | |
|---|---|
| *G11C 29/44* | (2006.01) |
| *G11C 29/46* | (2006.01) |
| *G11C 29/34* | (2006.01) |
| *G11C 29/26* | (2006.01) |
| *G11C 29/14* | (2006.01) |

(52) U.S. Cl.
CPC .............. *G11C 29/44* (2013.01); *G11C 29/14* (2013.01); *G11C 29/26* (2013.01); *G11C 29/34* (2013.01); *G11C 29/46* (2013.01)

(58) Field of Classification Search
CPC ......... G11C 29/14; G11C 29/26; G11C 29/18; G11C 29/36; G11C 29/46
See application file for complete search history.

(56) References Cited

U.S. PATENT DOCUMENTS

| | | |
|---|---|---|
| 5,173,906 A | 12/1992 | Dreibelbis |
| 5,535,164 A | 7/1996 | Adams |
| 6,324,657 B1 | 11/2001 | Fister |
| 6,625,769 B1 | 9/2003 | Huott |
| 6,681,359 B1 | 1/2004 | Au |
| 7,002,982 B1 | 2/2006 | Herbst |
| 7,017,020 B2 | 3/2006 | Herbst |
| 7,065,050 B1 | 6/2006 | Herbst |
| 7,073,105 B2 | 7/2006 | Knips |
| 7,096,393 B2 | 8/2006 | Caty |
| 7,149,941 B2 | 12/2006 | Adams |
| 7,269,766 B2 | 9/2007 | Slobodnik |

(Continued)

FOREIGN PATENT DOCUMENTS

GB      2405507 A      3/2005

*Primary Examiner* — Han Yang
(74) *Attorney, Agent, or Firm* — Cantor Colburn LLP; William Kinnaman

(57) ABSTRACT

A method for testing a circuit includes performing, by a test engine, a test of a memory element of the circuit, the test accesses a memory location in the memory element, the memory location is identified by an address, and the memory location is accessed via a first port associated with a first port select bit. The method further includes, in response to detecting a failure associated with the memory location, determining an existing entry for the address in a failed address register, and determining that the existing entry in the failed address register is associated with a second port select bit, distinct from the first port select bit. The method further includes, in response to the second port select bit being distinct from the first port select bit, setting a multi-port failure flag for the memory element that is being tested.

20 Claims, 5 Drawing Sheets

(56) References Cited

U.S. PATENT DOCUMENTS

| | | | |
|---|---|---|---|
| 7,634,702 B2 | 12/2009 | Kim | |
| 7,733,879 B2 | 6/2010 | Herbst | |
| 8,347,176 B2 | 1/2013 | Resnick | |
| 9,037,928 B2 | 5/2015 | Kleveland | |
| 9,361,196 B2 | 6/2016 | Kleveland | |
| 2002/0123854 A1 | 9/2002 | Engel | |
| 2002/0157051 A1 | 10/2002 | Eckelman | |
| 2004/0066695 A1 | 4/2004 | Anand | |
| 2006/0031726 A1 | 2/2006 | Zappa | |
| 2006/0215432 A1* | 9/2006 | Wickeraad | G11C 29/76 365/49.15 |
| 2009/0158224 A1* | 6/2009 | Barth, Jr. | G11C 29/72 716/136 |
| 2011/0029827 A1 | 2/2011 | Chickanosky | |
| 2014/0351565 A1 | 11/2014 | Hansen | |
| 2016/0321071 A1 | 11/2016 | Hansen | |
| 2017/0343601 A1 | 11/2017 | Casatuta | |

\* cited by examiner

TESTING MULTI-PORT ARRAY IN INTEGRATED CIRCUITS

BACKGROUND

The present invention relates to computing technology, and particularly an integrated circuit chip, and more particularly to diagnosing a failure of communication ports on the chip during chip tests.

An integrated circuit chip (IC chip, or chip) may include functional circuits, such as arithmetic logic unit (ALU), floating-point unit (FPU), registers, ports, scan latches, and memory. In order to ensure the quality of the chip, certain additional circuits are added to the chip for testing, repair, and test results logging. These circuits may include built-in self-test (BIST) engines, memory built-in self-test (Mem-BIST) engines, logic built-in self-test (LBIST) engines, and built-in self-repair (BISR) engines. Additional circuits, latches, and memory, such as failed logic registers and failed address registers, are typically added to the chip to store test results from these BIST engines. There is a trade-off as to how much of this information is retained on-chip (costing chip area) before being extracted by the tester vs. extracting fail data more frequently with the tester (costing more test time, but less chip area). It is desirable to have a chip test scheme that requires minimal test time for chip testing and minimal chip area for storing chip test results.

SUMMARY

According to one or more embodiments of the present invention, a method for testing a circuit includes performing, by a test engine, a test of a memory element of the circuit, the test accesses a memory location in the memory element, the memory location is identified by an address, and the memory location is accessed via a first port associated with a first port select bit. The method further includes, in response to detecting a failure associated with the memory location, determining an existing entry for the address in a failed address register, and determining that the existing entry in the failed address register is associated with a second port select bit, distinct from the first port select bit. The method further includes, in response to the second port select bit being distinct from the first port select bit, setting a multi-port failure flag for the memory element that is being tested.

According to one or more embodiments of the present invention, a system includes a memory element that is to be tested, a failed address register that stores information about one or more tests performed on the memory element, and a test engine coupled with the memory element and the failed address register, the test engine configured to test the memory element, the test accesses a memory location in the memory element, the memory location is identified by an address, and the memory location is accessed via a first port that is associated with a first port select bit. The system further includes a first logic circuit that sets a port-mismatch bit indicative of a comparison of the first port select bit and a second port select bit associated with an existing entry for the address in the failed address register, and the existing entry indicates another failure associated with the memory location. The system further includes a second logic circuit that sets a multi-port failure flag for the memory element that is indicative that the first port select bit is distinct from the second port select bit.

According to one or more embodiments of the present invention, an apparatus for implementing diagnostics of a circuit, the apparatus includes a test engine that tests a memory element of the circuit by accessing a memory location in the memory element, the memory location is identified by an address, and the memory location is accessed via a first port of the memory element, the first port is associated with a first port select bit. The apparatus further includes a first logic circuit configured to set a port-mismatch bit indicative of a comparison of the first port select bit and a second port select bit associated with an existing entry for the address in a failed address register, and the existing entry indicates another failure associated with the memory location. The apparatus further includes a second logic circuit configured to set a multi-port failure flag for the memory element that is indicative that the first port select bit is distinct from the second port select bit.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order, or actions can be added, deleted, or modified. Also, the term "coupled," and variations thereof describe having a communications path between two elements and do not imply a direct connection between the elements with no intervening elements/connections between them. All of these variations are considered a part of the specification.

DETAILED DESCRIPTION

Embodiments of the present invention facilitate determining a port on which a failure/defect was observed during a built-in self-test (BIST). An integrated circuit chip (IC chip, or chip) may include normal functional circuits, such as arithmetic logic unit (ALU), floating-point unit (FPU), registers, scan latches, and memory. In order to ensure the quality of the chip, certain additional circuitries are added to the chip to test the chip, to store the test results, and to repair the chips according to the test results. These circuitries may include a built-in self-test (BIST) engine, a memory built-in self-test (MemBIST) engine, and a built-in self-repair (BISR) engine. Additional memory, such as failed logic registers and failed address registers, may be added to store test results from these BIST engines. There is a trade-off as to how much of this information is retained on-chip (costing chip area) before being extracted by the tester vs. extracting fail data more frequently with the tester (costing more test time, but less chip area). The present disclosure is directed to a chip test scheme that optimizes test time for chip testing and optimizes chip area for storing chip test results.

Exemplary embodiments of the present invention relate to, among other things, integrated circuit chip (hereinafter chip) testing and repairing. In certain embodiments, the chip may include, central processing units (CPUs), digital signal processing (DSP) chips, graphical processing units (GPUs), system-on-a-chip (SOC), three-dimensional integrated circuits (3D-IC), application-specific integrated circuits (ASICs), and various memory chip such as volatile memory, random access memory (RAM), nonvolatile random access memory (NVRAM), read-only memory (ROM), programmable read-only memory (PROM), erasable programmable read-only memory (EPROM), and solid-state drive (SSD).

Figure 1:
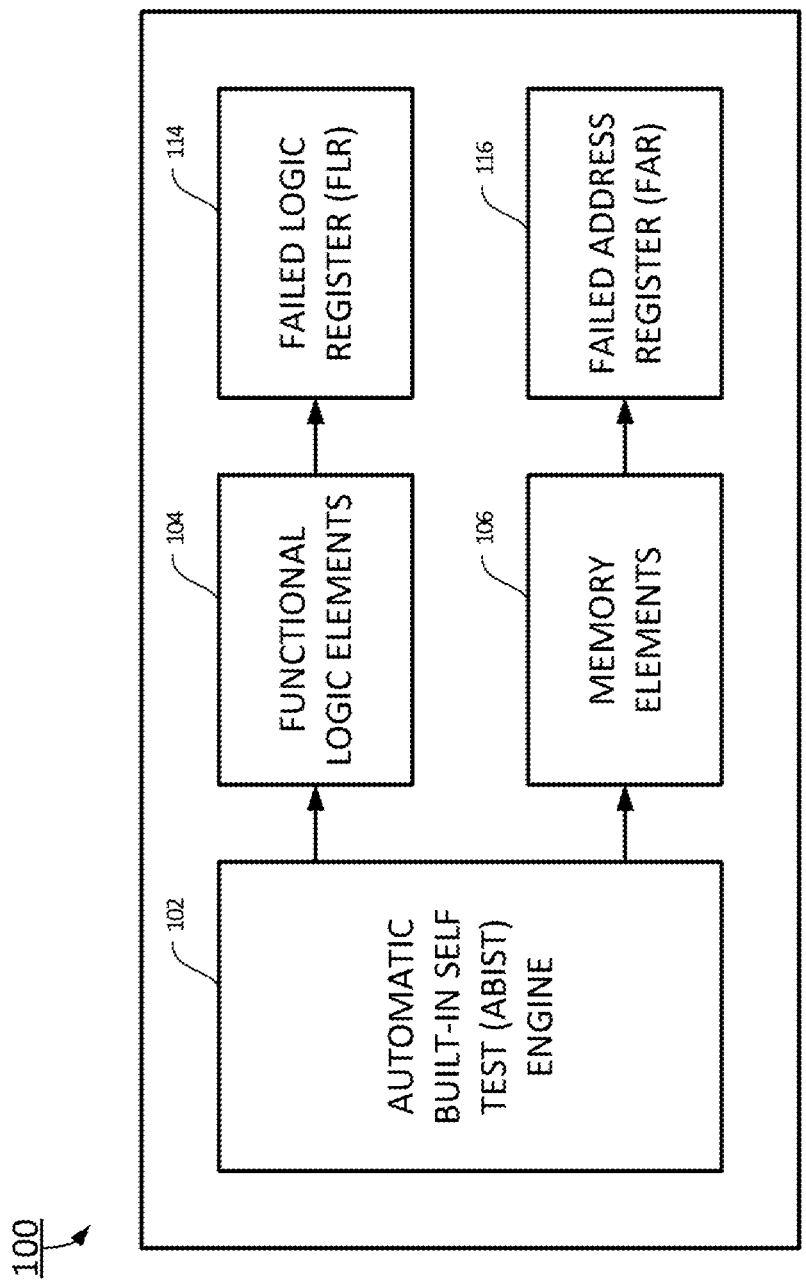
FIG. 1 is a block diagram showing an integrated circuit chip having its functional elements and additional elements for testing and repairing according to one or more embodiments of the present invention.

Referring now to FIG. 1, a block diagram showing an integrated circuit chip (chip) 100 having its functional elements and additional elements for testing and repairing according to certain embodiments of the present disclosure. The chip 100 may include one or more functional logic elements 104, and one or more memory elements 106. The functional logic elements 104 of the chip 100 may include one or more cores, one or more processing logic units, one or more arithmetic logic units (ALU), one or more floating-point units (FPU), one or more registers, one or more scan latches, and other necessary functional logic units to perform the functional the chip is designed to perform. Most chips may also include memory elements 106 of various sizes. In certain embodiments, the chip 100 may be a memory chip and contains memory cells in different capacities.

In one or more embodiments of the present invention, the memory element 106 can be a multi-port array. Multi-port arrays require concurrent access to data storage at the same time. This, in particular, applies to parallel systems comprising a large number of processors. In such systems, typically, a large number of instructions and data are processed in parallel, including multiple access to the same memory element 106. Various dynamic and/or static multi-port memory cells are known in the VLSI system design, and any of them can be used as the memory elements 106. In one or more embodiments of the present invention, the memory element 106 uses a random-access port and a serial access port, where data are transmitted from the random-access port to serial access port via a data register. Alternatively, in other embodiments, the memory element 106 is a two-port memory cell, which can be configured to perform as one port or two-port memory cells. Additional ports can be added to allow, for example, the use of the cell in a three-port register array.

In order to ensure the quality of the chip 100, additional circuitries may be included in the chip 100 to test, verify, and potentially repair the chip. These circuitries may include a BIST engine 102. The BIST engine 102 is used to test the functional logic elements 104, the memory elements 106, and any other elements of the chip 100. These tests yield certain test results, and these test results should be preserved for product quality determination, and/or for potential repair if additional redundancy elements are designed and built-in. In certain embodiments, the test results for functional logic elements 104 may be stored in one or more failed logic registers (FLR) 114, and the test results for memory elements 106 may be stored in one or more failed address registers (FAR) 116.

In certain embodiments, the one or more FLRs 114 may be pass/fail checkers, multiple-input-signature-registers (MISRs), or other checksum registers. In certain embodiments, FARs essentially capture the failing addresses of the memory under test and store them until testing is complete, allowing this information to be used for the potential repair of, (or rejection of), the memory under test, as well as provide diagnostic, analytic, and defect bit fail map data for yield learning. There may be multiple embodiments of FARs. These include "dedicated FARs," where each memory array instance on-chip has "dedicated FARs," and "shared FARs," where multiple memory array instances have their responses combined and failing addresses combined into 1 set of FARs. Shared FARs are generally employed in an effort to use the on-chip FAR area more efficiently. Because not all memory instances may require repairs and they rarely require the maximum number of possible repairs, sharing FARs allows the memory instances that need more repairs to use FAR space that is not needed by memory instances that don't need as many repairs. While this helps to reduce the FAR overhead on-chip, it is still common to need to do multiple passes of testing in order to extract all of the FAR data because it is often too costly to provide enough FAR area on-chip to store all the repairs needed by all of the memory instances.

During integrated circuit memory and logic testing, test results, signatures and other fail data are often collected and used for: (a) pass or fail determination, (b) partial good determination (where only part of the chip may be good and usable), (c) possible repair information for the device under test, (d) diagnostics for failing devices or sections of devices, and (e) analytics of fail data from improved yield learning.

Conventionally, a certain number of FLRs 114 and/or FARs 116 are built into the chip 100, and this number of FLRs 114 and/or FARs 116 usually is not big enough to collect all test results, signatures and other fail data. The tests of functional logic elements 104 and/or tests of the memory 106 may have to be divided into a certain number of partitions such that the amount FLRs 114 and/or FARs 116 built-in in the chip 100 may be big enough to store the test results, signatures and other fail data for each partition. Once one partition test is completed, the test results, signatures and other fail data may be transmitted out of the chip, the FLRs 114 and/or FARs 116 are reset, then the test for the next partition starts, until all partitions are tested, and the test results, signatures and other fail data are collected for each of the partitions.

Figure 2:
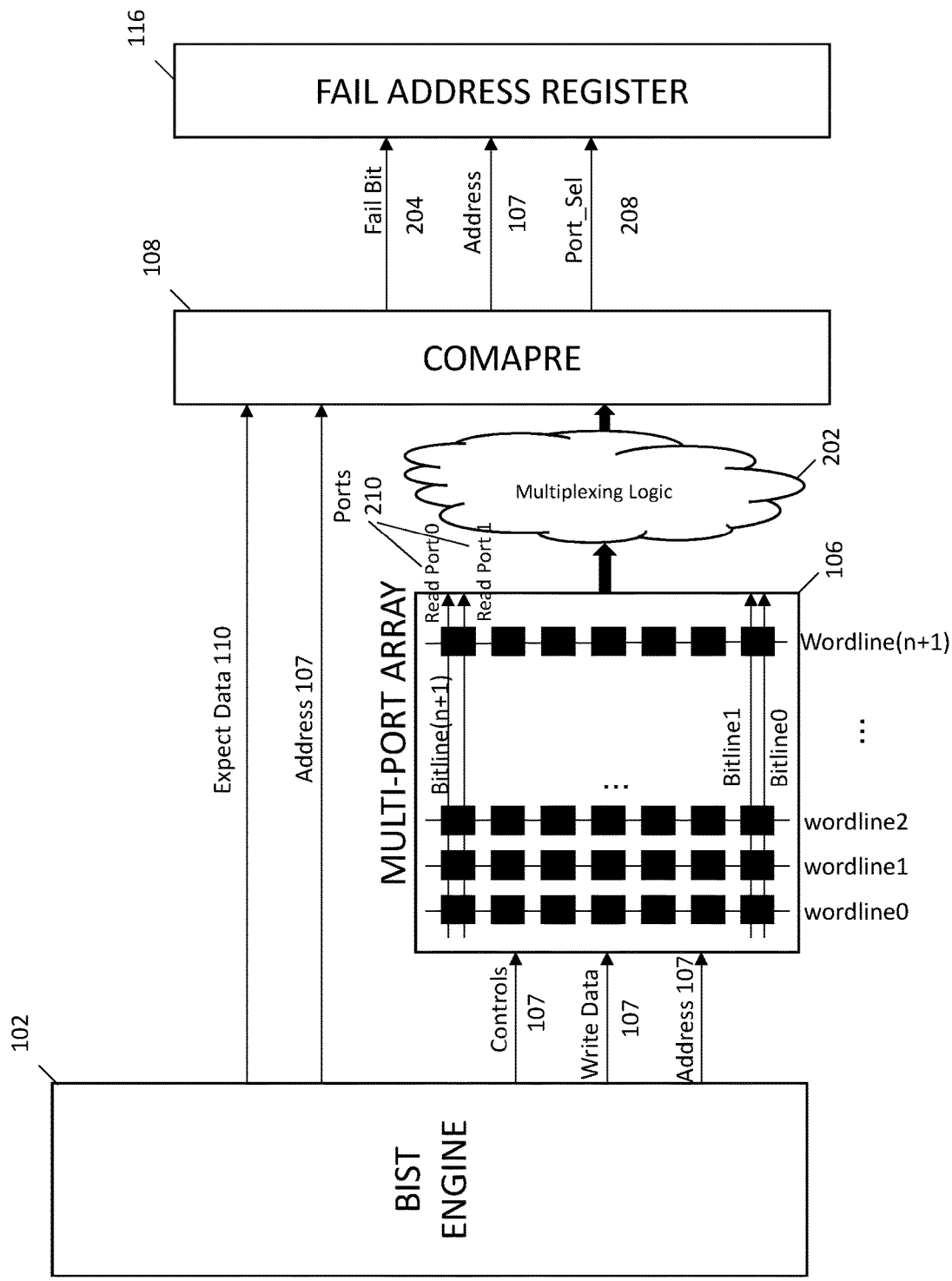
FIG. 2 shows a typical BIST implementation represented by memory array test system support elements and their configuration.

FIG. 2 shows a typical BIST implementation represented by memory array test system support elements and their configuration. The failure detection support described herein is, but not restricted to, two dimensional in reference to the row and column addressing within the structure of a memory 106 under test. There may exist a plurality of redundant row and column elements, thus supported by support registers 206. The support registers can include the FLR 114, and the FAR 116. The BIST engine 102 provides the deterministic array test patterns 107. The compare function 108 has as its inputs, the expected data vector 110, and the memory array outputs 112. It provides an overall pass/fail result signal 124, which is used in combination with the gating controls 126 from the BIST engine 102 to control the support registers 206 in establishing a failure/defect.

The compare function 108 may be used to implement an N-bit compare of the data out bus 112 of the memory 106 (e.g., dataouts 0:N) and the expect data bus 110 (e.g., 0:N) from the BIST engine 102. Overall, BIST error detection may then be accomplished as an N-way logical 'OR' determining if any mis-compare has occurred on a cycle-by-cycle basis. The error signal, or mis-compare, is also referred to as an 'rtfail' or real-time fail signal. For example, in memory array applications with two dimensional redundancy, whereby one dimension is in terms of row addressing, and the second dimension is in terms of column addressing across one or all data bits of the memory array, then this compare result bus 314 or overall error detection provides for a sufficient determination of a fail and location for purposes of result propagation to the support register apparatus 206.

A technical problem with BIST implementations is that the FAR 116 cannot log which port a failure was observed on. This prevents determining, for example, by a tester, from accurately knowing whether multiple ports have failed or if a single port has failed, and if so, which one. At present, identifying the failed ports requires multiple test iterations or such failures are ignored or not logged.

Embodiments of the present invention address such technical problems by adding a port select data bit 208 to the FAR 116 to log which port a failure was observed on, and by implementing multiplexing logic 202 to determine if a failure occurred on one or multiple ports with a multiple ports flag 312.

Figure 3:
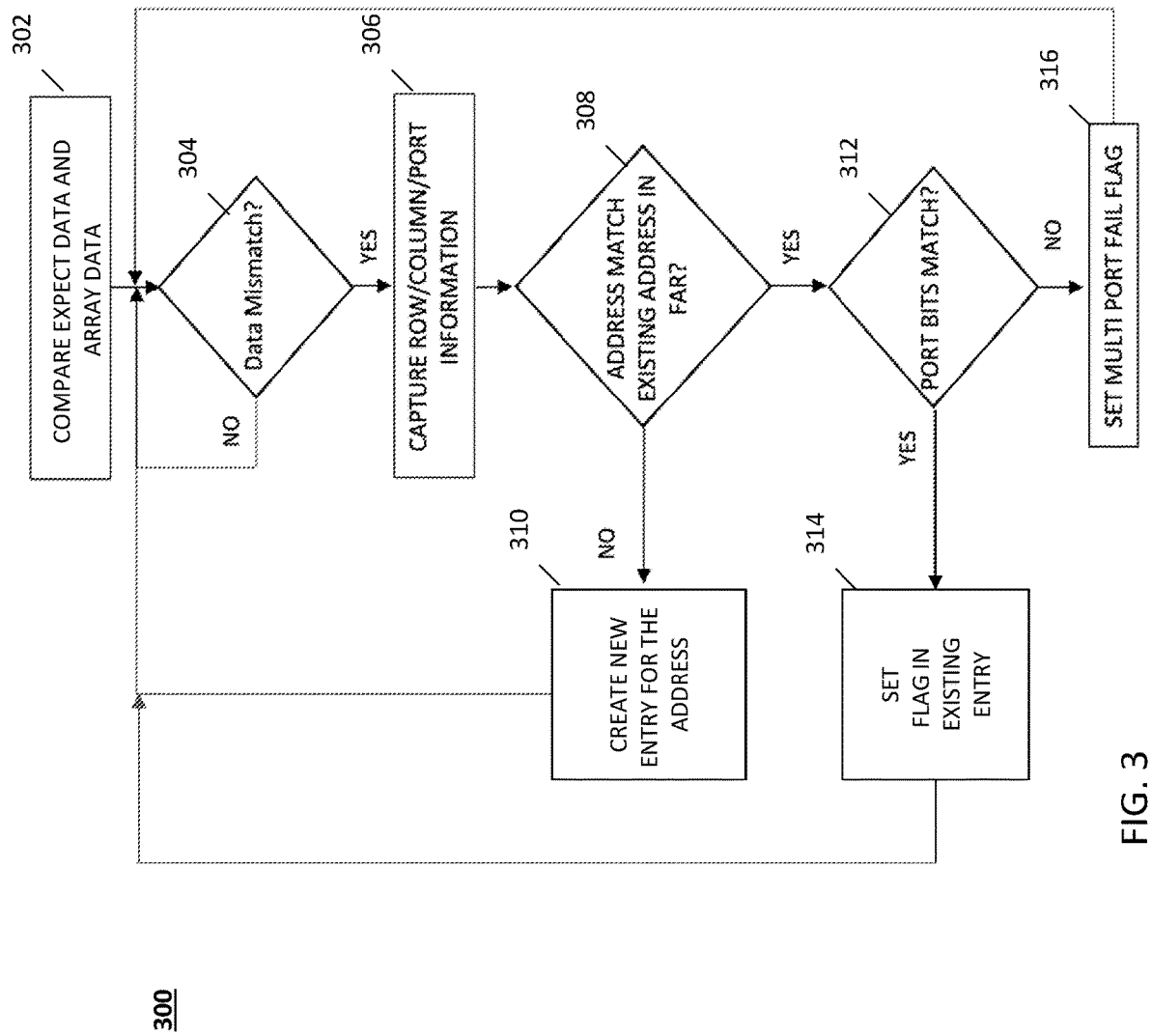
FIG. 3 depicts a flowchart of a method for logging port failures during BIST of a chip according to one or more embodiments of the present invention.

FIG. 3 depicts a flowchart of a method for logging port failures during BIST of a chip according to one or more embodiments of the present invention. The method 300 includes comparing expected data 110 from the BIST engine 102 and data from the memory element 106 that is being tested, at block 302. Data can be read out of the memory element 106 from multiple read ports 210. The data out from the memory element 106 is sent through the multiplexing logic 202 and compared against expected data 110 from the BIST engine 102 to determine a failure based on such comparison.

Further, method 300 includes determining the occurrence of a mismatch between the data from the memory element 106 and the expected data 110, at block 304. For example, the address 107 can specify a combination of one or more bit lines and one or more word lines of the memory element 106, the combination identifying particular memory locations in the memory element 106. The write data 107 is written into the identified memory locations using one or more ports of the memory element 106. Subsequently, the identified memory locations are read from by the compare block 108 to detect if there is a failure at the identified memory locations. If the data that is written and subsequently read match, the test is deemed to pass, i.e., failure has not occurred at least at the memory locations and the ports used for the read and write operations. In such cases, the BIST engine 102 repeats the test at other memory locations in the memory element 106. In the case that a mismatch occurs, the row/column/port information is captured corresponding to where the mismatch is detected, at block 306. The row/column/port information is contained in the address 107 of the memory locations being tested by the BIST engine 102.

Further, the method includes determining whether the address information matches an address of a failure that has been detected earlier, at block 308. The address, particularly, the row and column information from address 107 is compared with one or more address information that is stored in the FAR 116. The address information that is stored in the FAR 116 identifies one or more memory locations in the memory element 106 at which a failure was detected previously.

If the address 107 at which the failure is presently detected is a new location, i.e., the FAR 116 does not have the address 107 stored already, the method 300 includes storing the address 107 in a new entry in the FAR 116, at block 310.

Alternatively, if the address 107 of the present failure matches an existing entry (YES at block 308), the method 300 includes comparing whether the port select bit 208 matches a port bit 408 stored in an existing entry in the FAR 116, at block 312.

Figure 4:
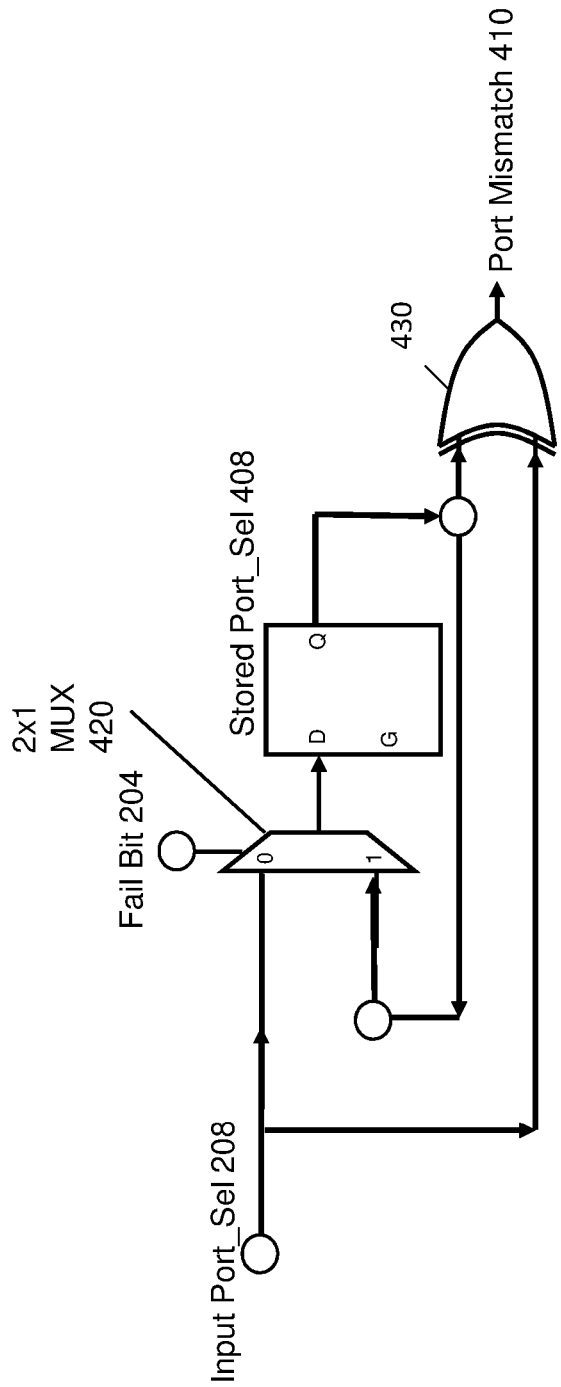
FIG. 4 depicts a block diagram depicting logic to determine port mismatch according to one or more embodiments of the present invention.

FIG. 4 depicts a block diagram depicting logic to determine port mismatch according to one or more embodiments of the present invention. The FAR 116 can include such logic in one or more embodiments of the present invention. The FAR 116 collects each port select bit 208 from the compare block 108. The "port select bit" is provided by the compare block as a piece of incoming failing port information. The description further is provided for a particular port 210 from the multi-port memory element 106, and the same can be applied to any of the ports from the multi-port memory element 106.

A port select bit 208 is forwarded by the compare block 108 to the FAR 116. The port select bit 208 corresponds to the specific port 210 from the memory element 106. In one or more embodiments of the present invention, the port select bit 208 is based on the address 107 that is being tested by the BIST engine 102.

The FAR 116 already stores existing values of port select bits 408, which are compared with the input port select bits 208 that are received from the compare block 108. The existing values of the port select bits 408 can represent whether the port corresponding to the port select bit 408 (or 208) was already experiencing a failure. The FAR 116, using the depicted logic, sets a port mismatch signal 410 to 1 (or 0) if the two corresponding port select bits 208, 408, are different. The comparison can be performed using an XOR gate 430 in one or more embodiments of the present invention. Other circuits can be used for the comparison in other embodiments.

In one or more embodiments of the present invention, a 2×1 multiplexer 420 is used for updating the existing port select bit 408 with the value of the input port select bit 208. The failure bit 204 is used as a selector for the multiplexer 420, and the existing port select bit 408 and the input port select bit 208 are input to the multiplexer 420. Based on the value of the failure bit 204, the stored port select bit 408 continues to have the previous value or is updated to the input port select bit 208. The failure bit 204 is received from the compare block 102 and represents whether the expected data 110 for the port 210 matched the actual value that is read from the memory element 106 via the port 210.

Accordingly, the output of the logic circuit 400 is the port mismatch signal 410 that indicates whether the input port select bit 208 differs from an existing port select bit 408 that was stored in the FAR 116. For example, if the two bit-values differ, the port mismatch signal 410 is set to 1 (or 0 in other embodiments), else if the two bit-values match, the port mismatch signal 410 is 0 (or 1 in other embodiments).

In addition, as described, the logic circuit 400 also updates the port selected bit 408 stored in the FAR 116 to the value of the input port select bit 208.

Referring back to the flowchart of method 300 in FIG. 3, if the port select bits 208, 408, are matching (YES at block 312), the method 300 includes marking/flagging the existing entry in the FAR 116, at block 314. The marking can include a count of a number of times the address 107 and the port select bits 408 that are stored in the FAR 116 are both matched. The existing entries that are marked/flagged in this manner represent that the memory location identified by the address 107 stored in the FAR 116 has experienced failure when accessed using the communication port identified by the port select bit 408 that is stored in the FAR 116.

Alternatively, in the case where the address 107 match and the port select bits 208, 408 do not match, the method 300 includes setting a multi-port failure flag, at block 316. The flag can be set to 0 or 1 (or any other predetermined value) to indicate that a failure occurs in the same row and column of the memory element 106, and at a different port.

Figure 5:
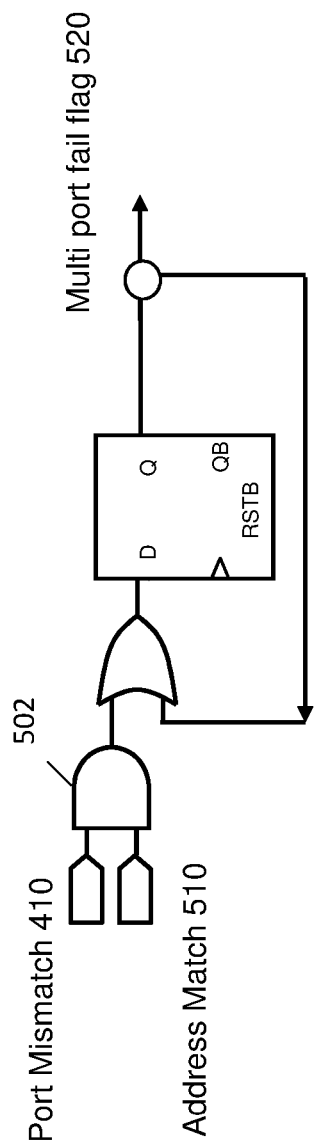
FIG. 5 depicts a block diagram depicting logic to check failures for a mismatching port and matching location according to one or more embodiments of the present invention.

FIG. 5 depicts a block diagram depicting logic to check failures for a mismatching port and matching location according to one or more embodiments of the present invention. The logic circuit 500 checks whether after the FAR 116 receives a first failure entry, a subsequent failure has a mismatching port and matching location in the memory element 106. The logic circuit 500 uses the port mismatch signal 410 from the logic circuit 400 as an input to an AND gate 502. Further, a bit indicative of whether the address 107 of the present failure matches the existing entry in the FAR 116 is input to the AND gate 502 as an address match bit 510. The output of the AND gate 502 is further passed to an OR gate 504. The OR gate 504 also receives the existing value of the multi-port failure flag 520. The multi-port failure flag 520 is initiated to 0 by default. The output of the OR gate 504 is stored in the FAR using a latch 506, for example. The multi-port failure flag 520 can be output when accessed to determine whether the memory element 106 experiences a multi-port failure when accessing the memory location identified by the address 107. The multi-port failure flag 520 will be set to 1 when the address match 510 is 1 (i.e., address matches), and the port mismatch signal 410 is 1 (i.e., port select bits do not match).

It should be noted that the logic circuit 500 can be implemented using different types of BOOLEAN gates than those described herein. Further, the multi-port failure flag 520 can be set different than that described herein, for example, the multi-port failure flag 520 is set to 0 to represent that the address matches and the port select bits mismatch.

Embodiments of the present invention improve the self-testing of chips and provide an improvement to computing technology. Further, embodiments of the present invention provide a practical application to improve the self-testing of chips. The improvement includes identifying if a cell/location in a memory element failed at one or multiple ports. This technical challenge is addressed by storing a port select bit in a FAR. The stored port select bit is compared to incoming port select signal to detect a port mismatch, which in conjunction with an address match is used to determine that the same address experiences failure via a different (or same) port in the memory element.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other devices to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

What is claimed is:

1. A method for testing a circuit, the method comprising:
performing, by a test engine, a test of a memory element of the circuit, wherein the test accesses a memory location in the memory element, the memory location is identified by an address, and the memory location is accessed via a first port associated with a first port select bit;

in response to detecting a failure associated with the memory location:
  determining whether there is an existing entry for the address in a failed address register;
  in response to determining that there is an existing entry for the address in the failed address register, determining whether the existing entry is associated with a second port select bit distinct from the first port select bit; and
  in response to determining that the existing entry is associated with a second port select bit distinct from the first port select bit, setting a multi-port failure flag for the memory element that is being tested.

2. The method of claim 1, wherein the test engine is a built-in self-test engine of the circuit.

3. The method of claim 1, wherein the method further comprises, in response to determining that the failed address register does not include an existing entry for the address, creating an entry for the address in the failed address register.

4. The method of claim 1, wherein the method further comprises, in response to the second port select bit being distinct from the first port select bit, storing the first port select bit in the failed address register.

5. The method of claim 1, wherein in response to detecting the failure associated with the memory location, a fail bit is set.

6. The method of claim 5, wherein a port-mismatch bit is set based on BOOLEAN logic of the fail bit, the first port select bit, and the second port select bit.

7. The method of claim 6, wherein the multi-port failure flag is set based on BOOLEAN logic of the port-mismatch bit and a bit indicative of the existing entry in the failed address register.

8. A system comprising:
  a memory element that is to be tested;
  a failed address register that stores information about one or more tests performed on the memory element;
  a test engine coupled with the memory element and the failed address register, the test engine configured to test the memory element, wherein the test engine accesses a memory location in the memory element, the memory location is identified by an address, and the memory location is accessed via a first port that is associated with a first port select bit;
  a first logic circuit configured to set a port-mismatch bit indicative of a comparison of the first port select bit and a second port select bit associated with an existing entry for the address in the failed address register, wherein the existing entry indicates another failure associated with the memory location; and
  a second logic circuit configured to set a multi-port failure flag for the memory element that is indicative that the first port select bit is distinct from the second port select bit.

9. The system of claim 8, wherein the test engine is a built-in self-test engine.

10. The system of claim 8, wherein the failed address register is configured to, in response to determining that the failed address register does not include an existing entry for the address, create an entry for the address in the failed address register.

11. The system of claim 8, wherein the first logic circuit is further configured to, in response to the second port select bit being distinct from the first port select bit, store the first port select bit.

12. The system of claim 8, further comprising a compare block that is configured to, in response to detecting a failure associated with the memory location, set a fail bit.

13. The system of claim 12, wherein the first logic circuit comprises a multiplexer that uses the fail bit as a selector and a BOOLEAN gate that computes the port-mismatch bit based on an output of the multiplexer and the first port select bit.

14. The system of claim 13, wherein the second logic circuit comprises an AND gate that compares a bit indicative of the existing entry in the failed address register and the port-mismatch bit, wherein the output of the comparison is used to compute the multi-port failure flag.

15. An apparatus for implementing diagnostics of a circuit, the apparatus comprising:
  a test engine configured to test a memory element of the circuit by accessing a memory location in the memory element, wherein the memory location is identified by an address, the memory location is accessed via a first port of the memory element, and the first port is associated with a first port select bit;
  a first logic circuit configured to set a port-mismatch bit indicative of a comparison of the first port select bit and a second port select bit associated with an existing entry for the address in a failed address register, wherein the existing entry indicates another failure associated with the memory location; and
  a second logic circuit configured to set a multi-port failure flag for the memory element that is indicative that the first port select bit is distinct from the second port select bit.

16. The apparatus of claim 15, wherein the first logic circuit is further configured to, in response to the second port select bit being distinct from the first port select bit, store the first port select bit.

17. The apparatus of claim 15, wherein the first logic circuit comprises a multiplexer that uses the fail bit as a selector and a BOOLEAN gate that computes the port-mismatch bit based on an output of the multiplexer and the first port select bit.

18. The apparatus of claim 17, wherein the second logic circuit comprises an AND gate that compares a bit indicative of the existing entry in the failed address register and the port-mismatch bit, wherein the output of the comparison is used to compute the multi-port failure flag.

19. The apparatus of claim 18, wherein the second logic circuit comprises an OR gate that compares the output of the AND gate with a stored value of the multi-port failure flag to update the multi-port failure flag.

20. The apparatus of claim 19, wherein the updated multi-port failure flag is stored in the second logic circuit.

* * * * *